United States Patent [19]
Shim et al.

[11] Patent Number: 5,225,360
[45] Date of Patent: Jul. 6, 1993

[54] MANUFACTURING METHOD OF SELF-ALIGNED GAAS FET USING REFRACTORY GATE OF DUAL STRUCTURE

[75] Inventors: Kyuhwan Shim; Chulsoon Park; Dojin Kim; Sungjae Maeng; Jeonwook Yang; Youngkyu Choi; Jinyeong Kang; Kyungho Lee; Jinhee Lee, all of Daejeon, Rep. of Korea

[73] Assignee: Electronics and Telecommunications Research Institute, Daejeon, Rep. of Korea

[21] Appl. No.: 813,278

[22] Filed: Dec. 26, 1991

[30] Foreign Application Priority Data

Dec. 26, 1990 [KR] Rep. of Korea .................. 90-21812

[51] Int. Cl.⁵ ........................................ H01L 21/338
[52] U.S. Cl. ..................... 437/41; 437/177; 437/178; 437/192; 437/912
[58] Field of Search ............... 437/177, 178, 179, 912, 437/41, 190, 192

[56] References Cited

U.S. PATENT DOCUMENTS

| 4,804,635 | 2/1989 | Young ................................. 437/41 |
| 4,965,218 | 10/1990 | Geissberger et al. ................. 437/41 |

FOREIGN PATENT DOCUMENTS

| 0211353 | 2/1987 | European Pat. Off. ............ 437/178 |
| 60-167467 | 8/1985 | Japan . |

OTHER PUBLICATIONS

Ghandhi, S. K., VLSI Fabrication Principles, 1983, John Wiley & Sons, pp. 435-439.

*Primary Examiner*—T. N. Quach
*Attorney, Agent, or Firm*—Larson and Taylor

[57] ABSTRACT

There is disclosed a manufacturing method of self-aligned GaAs FET using refractory gate with dual structure, the manufacturing method of the invention comprising the steps of: forming first photoresist pattern on a GaAs substrate to define an active region and ion-implanting n type impurity in the active region of the GaAs substrate; sequentially depositing a nitrogen-containing silicon layer and a metal layer on the substrate after removal of the first photoresist pattern; forming second photoresist pattern on the metal layer to define a gate; removing the silicon and metal layers using the second photoresist pattern as a gate mask to form the gate with dual structure of the silicon and metal layers; forming third photoresist pattern on the substrate to define source/drain regions after removal of the second photoresist pattern, and ion-implanting high-density impurity in the source/drain regions using the third photoresist pattern and the gate as a source/drain mask; annealing the substrate to make the silicon layer as upper side of the gate into metal-silicon-nitride material, and to make bottom portion of the metal layer as lower side of the gate into metal-silicon-nitride material; and forming ohmic contacts on the source/drain regions, respectively. A GaAs FET according to the invention is provided with a gate having low-resistance and improved schottky characteristics.

3 Claims, 3 Drawing Sheets

MANUFACTURING METHOD OF SELF-ALIGNED GAAS FET USING REFRACTORY GATE OF DUAL STRUCTURE

BACKGROUND OF THE INVENTION

1. Field of the Invention

The present invention relates to a method for manufacturing GaAs FET and, more particularly to a manufacturing method of GaAs FET (Field Effect Transistor) using refractory gate of dual structure.

2. Description of the Prior Art

FIGS. 1A to 1F show processes for manufacturing GaAs FET of the prior art using refractory gate. Referring to FIG. 1A, photoresist layer 104 is patterned on a semiconductor substrate 101 as a GaAs wafer in order to define an active region 101a of a semiconductor device, and ions of n type impurity are implanted in the active region 101 of the substrate 101.

In FIG. 1B, after removal of the patterned photoresist layer 104, WSi (tungsten silicon) layer 105 of predetermined thickness is deposited on the substrate 101 by means of sputtering process which is well-known in the art of the invention. Then, photoresist layer 104a is patterned on the WSi layer 105 in order to define a gate of GaAs FET, as shown in FIG. 1C.

Using the patterned photoresist layer 104a as a gate mask, as shown in FIG. 1D, the WSi layer is removed by dry ion-etching process which is well-known in the art, and thus the WSi layer 105a only under the patterned photoresist layer 104a is remained on the active region 101a. Then, the remained WSi layer 105a serves as the gate of GaAs FET.

In addition, after removal of the patterned photoresist layer 104a, photoresist layer 104b is patterned on the substrate 101 in order to define source/drain regions of the substrate 101 as shown in FIG. 1E, and impurity 101b with high density is ion-implanted in the source/drain regions. Finally, ohmic contacts 106a are formed on the source/drain regions.

Manufacturing method of GaAs FET as mentioned above is disclosed in Japanese patent number SHO 60-167475. In this method, gate of GaAs FET is made of tungsten compound such as WSi in order to prevent the gate from reacting on GaAs substrate during annealing process for ion-implant.

However, since material such as WSi has high in electric resistance, problem occurs in operating speed of GaAs FET. Accordingly, the above-mentioned method is largely limited in fabrication of high speed transistor or microwave transistor.

In recent, there is proposed a manufacturing method of GaAs FET in which gate has dual structure in order to reduce electric resistance of the FET. For example, gate has laminated structure in which on WSi layer (or WSiN layer) is deposited with metal such as gold or titanium/gold.

However, since the manufacturing method of the prior art as mentioned above is necessary to use ion-milling process for etching the metal, problems occur in accurate etching and impact of semiconductor substrate by etching ions during etching process.

Moreover, since metal such as gold is low in melting point, formation of gate using gold can not be applicable under circumstance of high temperature, and thus has to use rapidly heating process.

SUMMARY OF THE INVENTION

It is therefore the object of the present invention to provide a manufacturing method of self-aligned GaAs FET using refractory gate of dual structure in which refractory binder such as silicon is formed on GaAs substrate and metal with low-resistance is deposited on the refractory binder so that it can improve resistance characteristic.

According to the aspect of the present invention, there is provided a manufacturing method of self-aligned GaAs FET using refractory gate of dual structure comprising the steps of: forming first photoresist pattern on a GaAs substrate to define an active region and ion-implanting n type impurity in the active region of the GaAs substrate; sequentially depositing a silicon layer and a metal layer on the substrate after removal of the first photoresist pattern; forming second photoresist pattern on the metal layer to define a gate; removing the silicon and metal layers using the second photoresist pattern as a gate mask to form the gate with dual structure of the silicon and metal layers; forming third photoresist pattern on the substrate to define source/drain regions after removal of the second photoresist pattern, and ion-implanting high-density impurity in the source/drain regions using the third photoresist pattern and the gate as a source/drain mask; annealing the substrate to make the silicon layer as upper side of the gate into metal-silicon material, and to make bottom portion of the metal layer as lower side of the gate into metal-silicon material; and forming ohmic contacts on the source/drain regions, respectively.

In aforesaid method, said metal layer may be made of at least one of tungsten, tantalum, platinum, molybdenum, and titanium. Also, said gate may have T-shaped structure, utilizing a difference from each other in etching selection ratio between the metal layer and the silicon layer, and etching selection ratio between the silicon layer and the substrate, when the gate is formed.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENT(S)

Figure 1A:
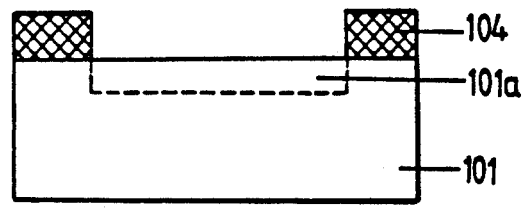
FIGS. 1A to 1F are process steps, in sectional-view, in accordance with the manufacturing method of self-aligned GaAs FET of prior art.
Figure 1B:
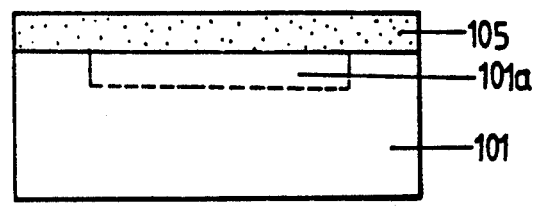
Figure 1C:
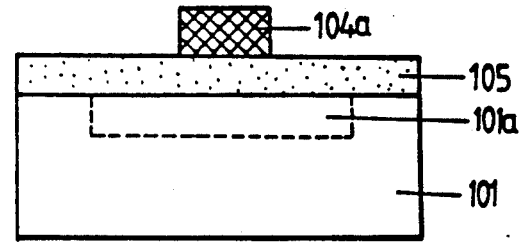
Figure 1D:
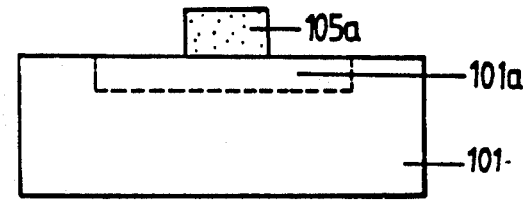
Figure 1E:
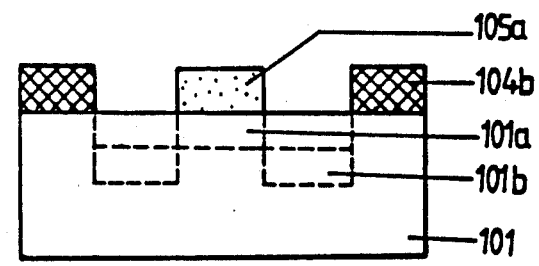
Figure 1F:
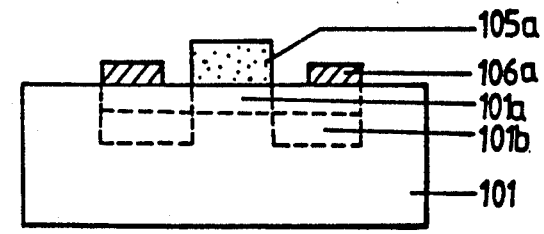
Figure 2A:
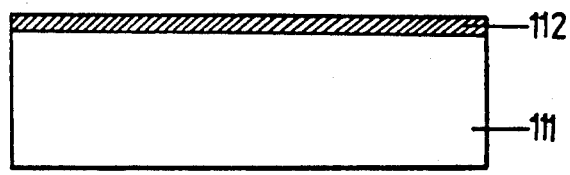
FIGS. 2A to 2F are process steps, in sectional-view, in accordance with the manufacturing method of self-aligned gate according to the embodiment of the present invention.

Referring to FIG. 2A, there is illustrated that on a GaAs substrate 111 is formed a silicon layer 112 having about 50 nm to 200 nm in thickness by means of chemical vapor deposition process as well-known in this art. On the other hand, the silicon layer 112 can be deposited by means of one method of plasma chemical vapor deposition, ion-deposition, sputtering, vacuum evaporation, and electron beam deposition.

Figure 2B:
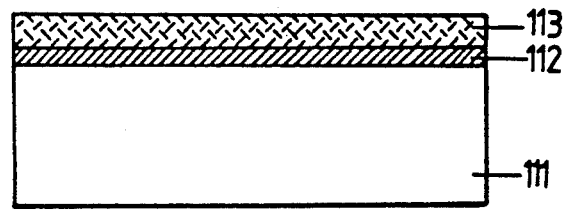
Figure 2C:
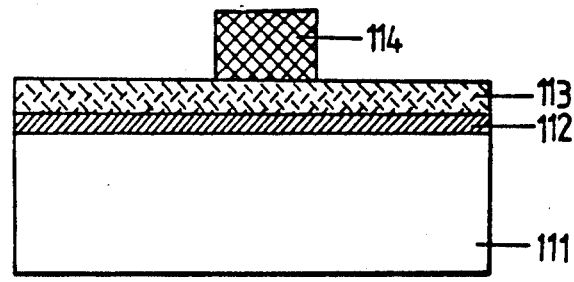

In FIG. 2B, on the silicon layer 112 is coated a refractory metal layer 113 of about 50 nm to 400 nm by means of chemical deposition process, then the metal layer 113 is made of any one of tungsten, tantalum, platinum, molybdenum, and titanium. Subsequently, a photoresist 114 is patterned on the metal layer 113 in order to define a gate region, as shown in FIG. 2C.

Figure 2D:
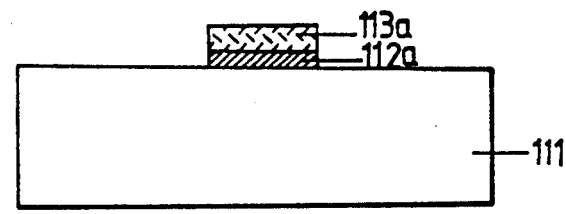
Figure 2E:
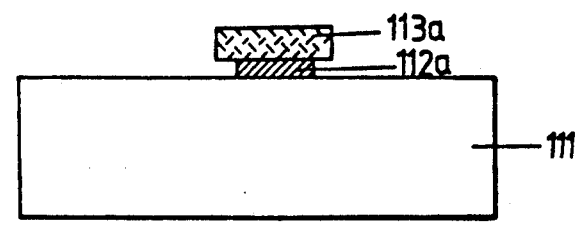

Using the patterned photoresist 114 as a gate mask, the metal and silicon layers 113, 112 are removed by a dry or wet etching process, as well-known in the art, so that metal and silicon layers 113a, 112a just under the patterned photoresist 114 can exist as shown in FIG. 2D. The metal and silicon layers 113a, 112a serve as the gate with dual structure. Also, an etching selection ratio between the metal and silicon layers is larger than that between the silicon layer and the GaAs substrate. When the metal and silicon layers are etched by using difference of the etching selection ratios, the metal layer is excessively etched so that the gate having dual structure can be formed in T-shape, as depicted in FIG. 2E.

Figure 2F:
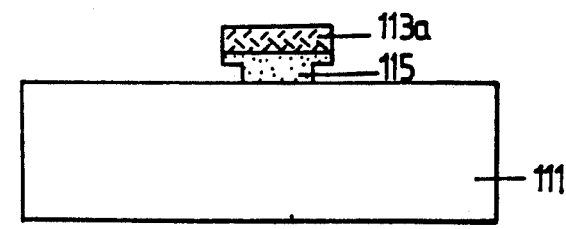

With reference to FIG. 2F, by ion-implantation, deposition of protective layer, and active annealing process, ions implanted in the respective layers 113a, 112a are reciprocally diffused between the layers 113a and 112a to chemically react upon each other, and then the metal layer 113a of the gate is changed to be low in electrical resistance. Also, the silicon layer 112a of the gate is changed into a refractory metal-silicon layer 115 and a potion of the metal layer 113a adjacent to the silicon layer 112a is changed into a refractory metal-silicon layer.

Accordingly, the refractory gate manufactured in accordance with the embodiment of the present invention is low in electrical resistance and good in schottky characteristics. In this embodiment, to bind the metal layer of the gate on the substrate, the silicon layer is used as a refractory binder. On the other hand, although the silicon layer containing nitrogen is used as a refractory binder, the gate may have the same effects as described above.

Using the nitrogen containing silicon layer as a refractory binder, it is also understood that the nitrogen containing silicon layer is changed into a metal-silinitride layer, and therefore a refractory gate manufactured by the method is low in electrical resistance and good in schottky characteristics.

FIGS. 3A to 3F show process steps, in sectional-view, in accordance with the manufacturing of self-aligned GaAs FET to which the manufacturing method of the self-aligned according to the invention is applied.

Figure 3A:
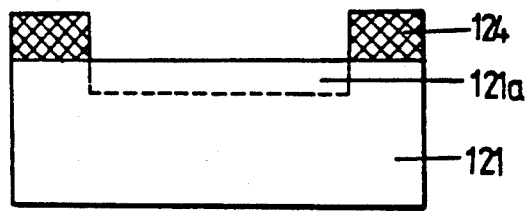
FIGS. 3A to 3F are process steps, in sectional-view, in accordance with the manufacturing method of self-aligned GaAs FET to which the manufacturing method of the self-aligned gate is applied.

Referring to FIG. 3A, a photoresist 124 is patterned on a GaAs substrate 121 to define an active region 121a, and then n type impurity is implanted in the active region 121a using the patterned photoresist as a mask.

Figure 3B:
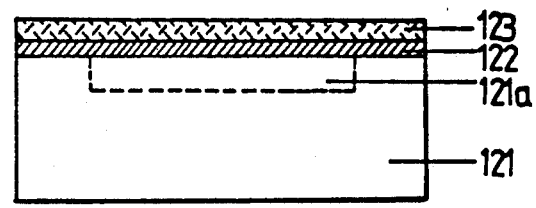

Subsequently, after removal of the patterned photoresist, a silicon layer (or a nitride containing silicon layer) 122 is deposited on the GaAs substrate 121 and a refractory metal layer 123 is coated on the silicon layer 122, as shown in FIG. 3B.

Figure 3C:
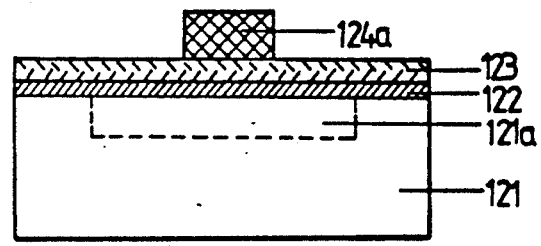

FIG. 3C shows that a photoresist 124a is patterned on the metal layer 123 to define a gate region.

Figure 3D:
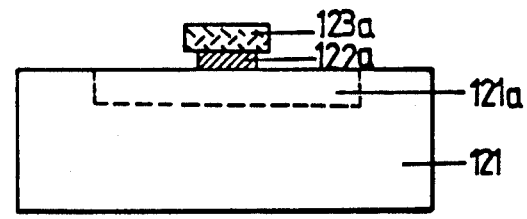

In FIG. 3D, using the patterned photoresist 124a as a mask, the metal and silicon layers are removed by an etching method as well-known in the art except those just under the photoresist 124a to form a gate having dual structure. In this process step, the dual structure for a gate can be made in T shape by means of excessive etching, If necessary.

Figure 3E:
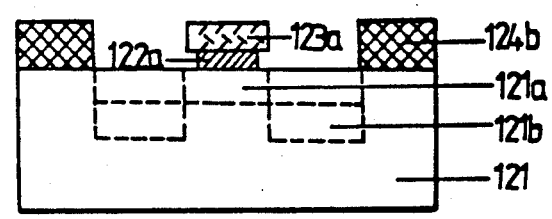

With reference to FIG. 3E, a photoresist 124b is patterned on the GaAs substrate 121 to define source/drain regions 121b, and then n type impurity with high-density is implanted in the source/drain regions, using the patterned photoresist 124b and the gate 122a, 123a as a mask. Subsequently, in order to active the implanted high-density impurity, the substrate is rapidly annealed under high temperature circumstance.

Figure 3F:
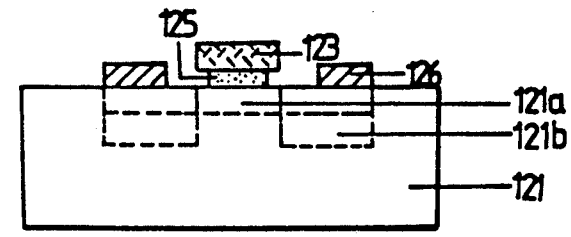

Accordingly, ions in the metal and silicon layers 122a, 123a of the gate are reciprocally diffused to chemically react on each other, and thus the silicon layer 122a is changed into a refractory metal-silicon layer (a metal-silicon-nitride layer) 125, as shown in FIG. 3F, and also a portion of the metal layer 123a adjacent to the silicon layer 122a is changed into a metal-silicon layer (a metal-silicon-nitride layer). Finally, manufacturing of a GaAs FET is completed by formation of ohmic contacts on the source/drain regions.

Since The gate according to the present invention is provided with dual structure in which on a surface of a GaAs substrate is formed a metal-silicon layer (or a metal-silicon-nitride layer) as a binder and on the metal-silicon layer is coated a metal layer having low-resistance, A GaAs FET having the gate can be improved in schottky characteristics and thermal stability of binder.

Moreover, the gate can be manufactured in various types of structure such as T-shape, or the like, by using difference of etching selection ratios among GaAs, metal, and silicon, resistance of the gate can be reduced and also lightly doped drain (LDD) can be applied to the manufacturing method of the present invention.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A manufacturing method of self-aligned GaAs FET using refractory gate with dual structure comprising the steps of:

forming a first photoresist pattern on a GaAs substrate to define an active region and ion-implanting n type impurity in the active region of the GaAs substrate;

sequentially depositing a nitrogen-containing silicon layer and a metal layer on the substrate after removal of the first photoresist pattern;

forming a second photoresist pattern on the metal layer to define a gate;

removing the nitrogen-containing silicon and metal layers using the second photoresist pattern as a gate mask to form the gate with dual structure of the nitrogen-containing silicon and metal layers just under the second photoresist pattern;

forming a third photoresist pattern on the substrate to define source/drain regions after removal of the second photoresist pattern, and ion-implanting high-density impurity in the source/drain regions using the third photoresist pattern and the gate as a source/drain mask;

annealing the substrate to change the metal as upper side of the gate into metal having low-resistivity, and to make the nitrogen-containing silicon layer as lower side of the gate into metal silinitride material; and forming ohmic contacts on the source/drain regions, respectively.

2. The manufacturing method of self-aligned GaAs FET according to claim 1, wherein said metal layer is made of one of tungsten, tantalum, platinum, molybdenum, and titanium.

3. The manufacturing method of self-aligned GaAs FET according to claim 1, wherein said gate has T-shaped structure, using a difference of the etching selection ratio among the metal layer, the nitrogen-containing silicon layer, and the substrate, when the gate is formed.

* * * * *